United States Patent
Abe et al.

(10) Patent No.: US 7,378,926 B2
(45) Date of Patent: May 27, 2008

(54) SINGLE CRYSTALLINE MAGNETIC GARNET AND YIG DEVICE

(75) Inventors: Yoshikazu Abe, Tokyo (JP); Takashi Watanabe, Tokyo (JP)

(73) Assignee: Advantest Corp., Tokyo (JP)

(*) Notice: Subject to any disclaimer, the term of this patent is extended or adjusted under 35 U.S.C. 154(b) by 114 days.

(21) Appl. No.: 11/359,691

(22) Filed: Feb. 22, 2006

(65) Prior Publication Data

US 2006/0214750 A1    Sep. 28, 2006

Related U.S. Application Data

(63) Continuation of application No. PCT/JP2004/011985, filed on Aug. 20, 2004.

(30) Foreign Application Priority Data

Aug. 26, 2003   (JP)   ............... 2003-301434

(51) Int. Cl.
*H01P 7/00* (2006.01)
(52) U.S. Cl. .................................. 333/219.2
(58) Field of Classification Search ............. 333/219.2
See application file for complete search history.

(56) References Cited

U.S. PATENT DOCUMENTS 4,155,053 A * 5/1979 Stitzer et al. ............... 333/17.2
4,988,959 A * 1/1991 Khanna et al. ........... 331/117 D
6,712,902 B2 * 3/2004 Geho ........................... 117/49
2003/0041797 A1   3/2003 Geho
2003/0080315 A1 * 5/2003 Yamamoto et al. ....... 252/62.57

FOREIGN PATENT DOCUMENTS

| JP | 55-143009  | 11/1980   |
|----|------------|-----------|
| JP | 05-251788  | 9/1983    |
| JP | 59054700   | * 3/1984  |
| JP | 05-070144  | 3/1993    |
| JP | H09-270605 | 10/1997   |
| JP | 2003-055096| 2/2003    |

* cited by examiner

*Primary Examiner*—Robert J. Pascal
*Assistant Examiner*—Kimberly E Glenn
(74) *Attorney, Agent, or Firm*—Muramatsu & Associates

(57) ABSTRACT

A YIG device comprises a resonator including a YIG element 16 of a single crystalline yttrium iron garnet having a part of yttrium substituted with gadolinium, which is formed in a spherical shape, and magnetic field applying means 20 for applying a magnetic field to the YIG element 16 to resonate the YIG element, whereby the YIG device can have a small ΔH and a large threshold electric power for generating the resonance saturation.

3 Claims, 8 Drawing Sheets

SINGLE CRYSTALLINE MAGNETIC GARNET AND YIG DEVICE

CROSS REFERENCE TO RELATED APPLICATIONS

This application is a Continuation of International Application No. PCT/JP2004/011985, with an international filing date of Aug. 20, 2004, which designating the United States of America.

TECHNICAL FIELD

The present invention relates to a single crystalline magnetic garnet and a YIG device, more specifically, a single crystalline crystal garnet having a small full width at half maximum of the magnetic resonance spectrum ($\Delta H$) and a large threshold electric power for generating resonance saturation, and a YIG device using the single crystalline magnetic garnet.

BACKGROUND ART

As oscillators and filters in the microwave frequency band, the YIG (Yttrium Iron Garnet) device is known. The YIG device utilizes the characteristics of yttrium iron garnet, which is a kind of ferrite, where Q values of the ferrimagnetic resonance are very high, which is suitable for use as microwave band variable tuning resonators and variable tuning oscillators.

The YIG device is used in the local oscillators and filters of measuring instruments, such as spectrum analyzers, network analyzer, etc, and is an important constituent part that plays an important role in the performance of these measuring instruments.

The principal element forming the YIG device is a YIG element. YIG crystal made of magnetic garnet material whose basic composition is expressed by the chemical expression $Y_3Fe_5O_{12}$ is machined in a spherical shape to form the YIG element.

In the YIG device, it is required as a characteristic of the YIG crystal that the full width at half maximum of the magnetic resonance spectrum (hereinafter called "$\Delta H$") is small. The $\Delta H$ of the magnetic garnet material is generally expressed by $$\Delta H = \Delta Hi + \Delta Hp + \Delta Ha.$$

Here, $\Delta Hi$ is an intrinsic $\Delta H$ of the material having the same composition. $\Delta Hp$ is a part contributed by demagnetizing fields around scratches, pores or different phases. $\Delta Ha$ is a part contributed by internal magnetic fields based on crystalline magnetic anisotropy.

When the YIG crystal has lattice defects, the precession of the spins in the YIG crystal becomes disuniform, which results in RF characteristics degradation, such as decrease of the Q value, occurrence of parasitic resonance, and occurrence of spurious caused by them, etc. Accordingly, in the YIG device requiring the $\Delta H$ to be small, it is preferable to use the single crystalline YIG.

Patent Reference 1: Japanese published unexamined patent application No. Hei 09-270605

Patent Reference 2: Japanese published unexamined patent application No. Hei 06-236814

Patent Reference 3: Japanese published unexamined patent application No. Hei 08-165197

Patent Reference 4: Japanese published unexamined patent application No. Hei 10-233308

DISCLOSURE OF INVENTION

Problems to be Solved by the Invention

An input power to be applied to the YIG crystal is increased, whereby an output power of the YIG device can be increased. However, when the input power exceeds a certain threshold value (threshold electric power), phenomena (resonance saturation phenomena) takes place in which an increase rate of the output power becomes lower, and the output power gradually approaches finally to a certain value.

In this resonance saturation phenomena, in terms of resonance, the Q value goes on to decrease as the input power is increased. This is because the precession of the spins becomes disuniform, and the loss becomes large. As the input power is further increased, according to the degradation of the Q value, the resonance takes place even with a frequency of a half the resonance frequency.

The resonance saturation phenomena more tends to take place in devices of smaller $\Delta H$ and is significant especially in YIG devices using single crystal materials of small $\Delta H$. However, conventionally the resonance saturation phenomena of the YIG crystal has not been sufficiently studied, and no countermeasures have been made for the phenomena.

An object of the present invention is to provide a single crystalline magnetic garnet having a small $\Delta H$ and a large threshold electric power for the resonance saturation, and a YIG device using the single crystalline magnetic garnet.

Means for Solving the Problems

According to one aspect of the present invention, there is provided a single crystalline magnetic garnet comprising a single crystal of a gadolinium-substituted yttrium iron garnet having a part of yttrium substituted with gadolinium.

In the above-described single crystalline magnetic garnet, it is possible that a composition of the gadolinium-substituted yttrium iron garnet is $Y_{3-x}Gd_xFe_5O_{12}$, and a composition ratio x of gadolinium is in the range of $0<x<0.1$.

In the above-described single crystalline magnetic garnet, it is also possible that a part of iron is substituted with at least one element selected out of groups including trivalent transition metal elements and group-III elements.

In the above-described single crystalline magnetic garnet, it is also possible that a composition of the gadolinium substituting yttrium iron garnet is $Y_{3-x}Gd_xFe_{5-y}M_yO_{12}$, and a composition ratio y of the element M substituting the iron is in the range of $0 \leq y < 1.5$.

According to another aspect of the present invention, there is provided a YIG element comprising a single crystalline yttrium iron garnet having a part of yttrium substituted with gadolinium, which is formed in a spherical shape.

According to further another aspect of the present invention, there is provided a resonator comprising: a YIG element of a single crystalline yttrium iron garnet having a part of yttrium substituted with gadolinium, which is formed in a spherical shape; and a magnetic field applying means for applying a magnetic field to the YIG element to resonate the YIG element.

According to further another aspect of the present invention, there is provided a YIG device comprising: a resonator including a YIG element of a single crystalline yttrium iron garnet having a part of yttrium substituted with gadolinium, which is formed in a spherical shape, and magnetic field applying means for applying a magnetic field to the YIG element to resonate the YIG element.

According to further another aspect of the present invention, there is provided a method for producing a single crystalline magnetic garnet comprising: growing a single crystal of yttrium iron garnet having a part of yttrium substituted with gadolinium by TSFZ method.

Effects of the Invention

According to the present invention, a single crystal of YIG having a part of yttrium substituted with gadolinium is used, whereby the threshold electric power for generating the resonance saturation of the YIG element can be increased. The composition of the YIG crystal is expressed by $Y_{3-x}Gd_xFe_5O_{12}$, and the composition ratio of gadolinium is set in the range of $0<x<0.1$, whereby the increase of the $\Delta H$ can be suppressed small, while the threshold electric power for the resonance saturation can be increased. The temperature dependency of the $\Delta H$ can be made low. The composition ratio of gadolinium is set near 0.05, whereby the $\Delta H$ of the YIG device in the temperature range where the YIG is generally used can be made substantially constant.

EXPLANATION OF REFERENCE NUMBERS

Figure 1A:
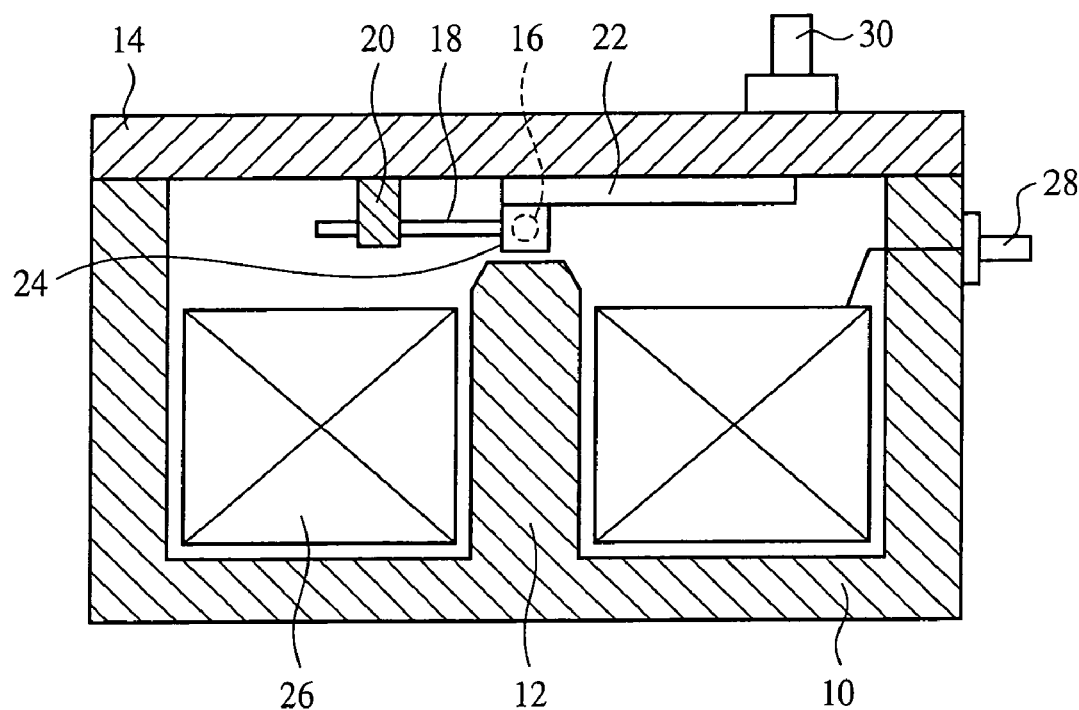
FIGS. 1A and 1B are diagrammatic sectional views showing the YIG device according to one embodiment of the present invention, which show a structure thereof.

10 . . . pot-shaped magnetic core
12 . . . central core
14 . . . plate-shaped magnetic core
16 . . . YIG crystal
18 . . . support rod
20 . . . fixing means
22 . . . integrated circuit board
24 . . . coupling coil
26 . . . excitation coil
28 . . . power source terminal
30 . . . coaxial connector
32 . . . resonator
34 . . . transistor
36 . . . inductor
38 . . . matching means
40 . . . raw material support rod
42 . . . crystal raw material rod
44 . . . seed crystal supporting means
46 . . . seed crystal
48 . . . upper main shaft
50 . . . lower main shaft
52 . . . quartz glass pipe
54 . . . ambient gas inlet port
56 . . . ambient gas outlet port
58 . . . ellipsoidal mirror
60 . . . halogen lamp
62 . . . molten zone
64 . . . CCD camera
66 . . . input coupling loop
68 . . . output coupling loop
70 . . . magnet

BEST MODES FOR CARRYING OUT THE INVENTION

The YIG device according to one embodiment of the present invention will be explained with reference to FIGS. 1A to 7.

Figure 1B:
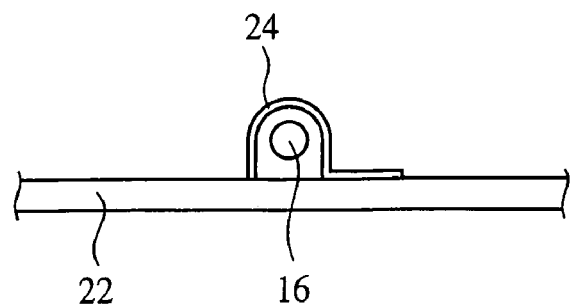
Figure 2:
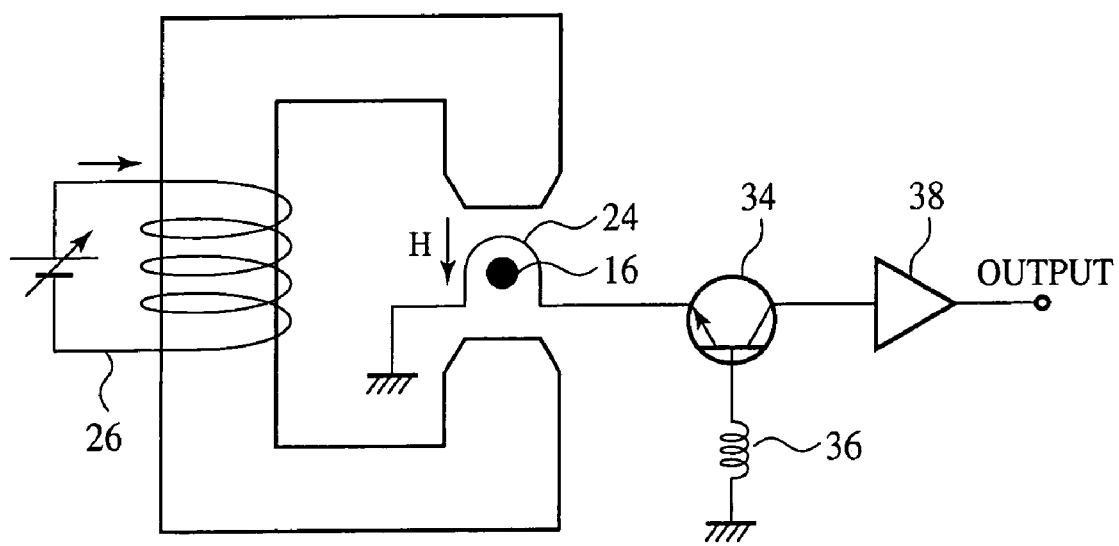
FIG. 2 is a diagram of the oscillation circuit of the YIG device according to the embodiment of the present invention.
Figure 3:
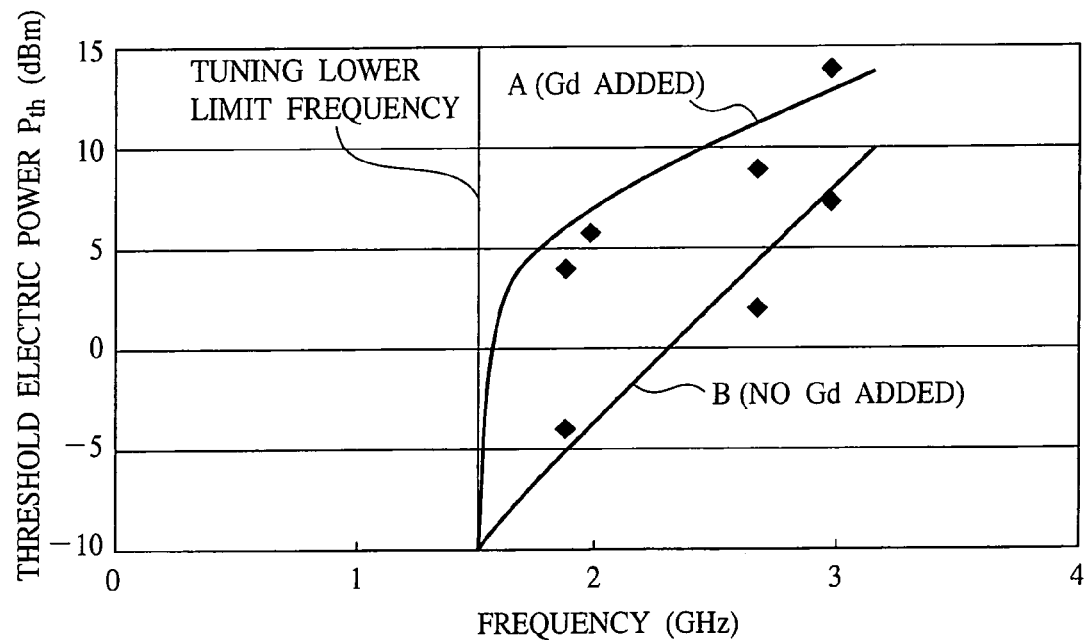
FIG. 3 is a graph showing relationships between the threshold electric power and the frequency.
Figure 4:
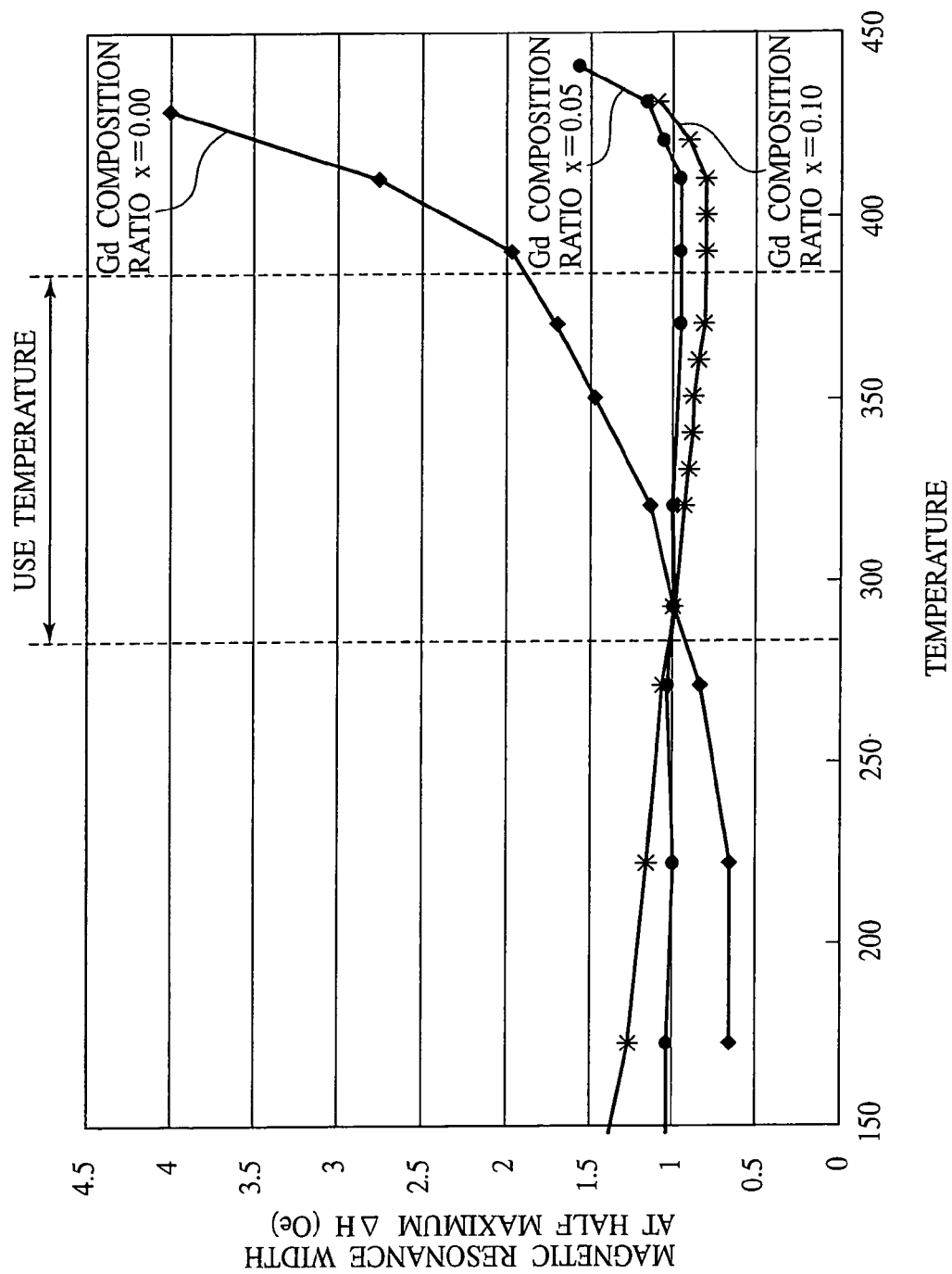
FIG. 4 is a graph showing the temperature dependency of the $\Delta H$.
Figure 5:
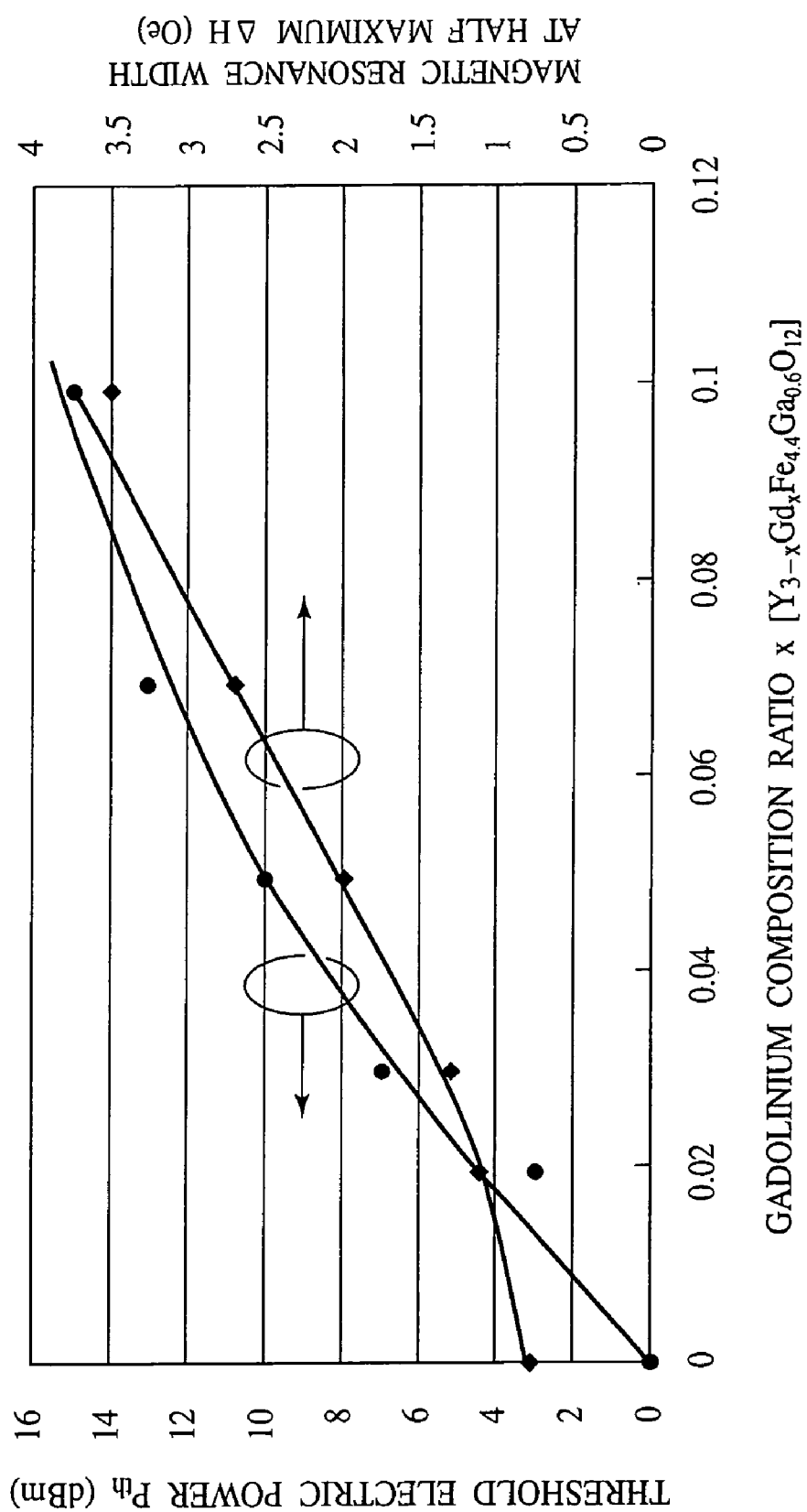
FIG. 5 is a graph showing relationships between the threshold electric power and the gadolinium composition ratio and relationships between the $\Delta H$ and the gadolinium composition ratio.
Figure 6:
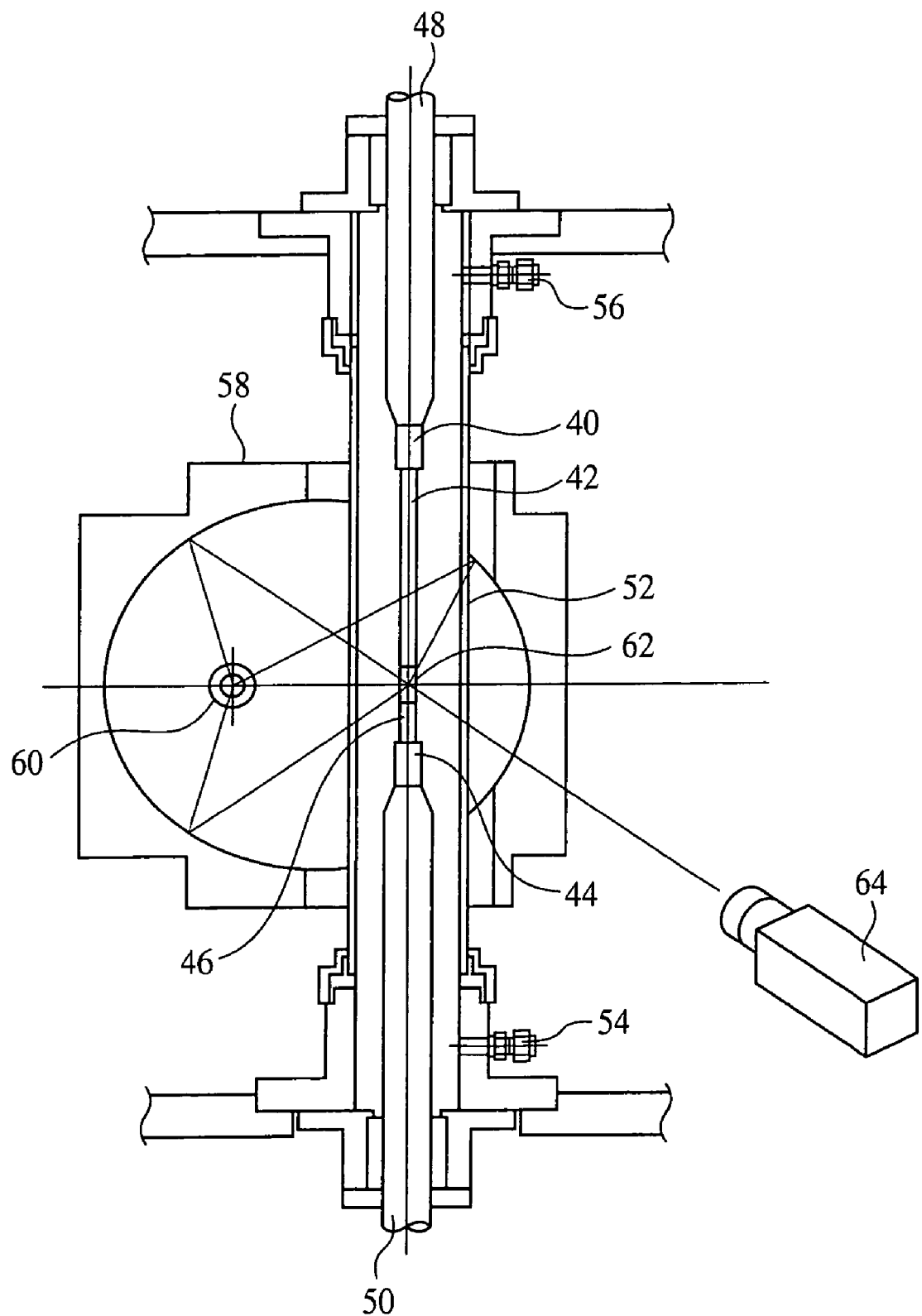
FIG. 6 is a diagrammatic sectional view showing the infrared concentrated heating furnace used in the crystal growth by TSFZ method.
Figure 7:
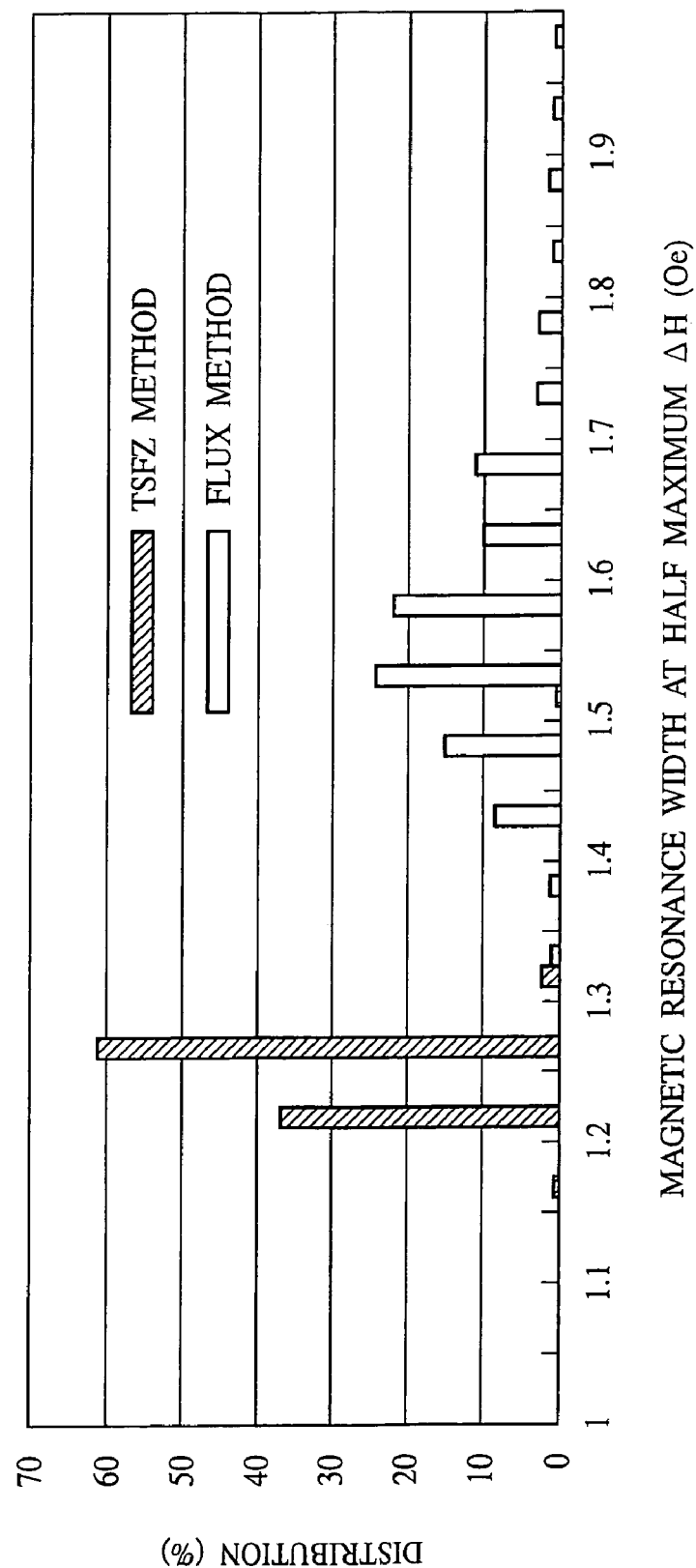
FIG. 7 is a graph showing fluctuations of the $\Delta H$ of the YIG crystal formed by TSFZ method and the YIG crystal formed by flux method.

FIGS. 1A and 1B are sectional views showing the YIG device according to the present embodiment, which show a structure thereof. FIG. 2 is a diagram of the oscillation circuit of the YIG device according to the present embodiment. FIG. 3 is a graph showing relationships between the threshold electric power and the frequency. FIG. 4 is a graph showing the temperature dependency of the $\Delta H$. FIG. 5 is a graph showing relationships between the threshold electric power and the gadolinium composition ratio and relationships between the $\Delta H$ and the gadolinium composition ratio. FIG. 6 is a diagrammatic sectional view showing the infrared concentrated heating furnace used in the crystal growth by TSFZ method. FIG. 7 is a graph showing the fluctuations of the $\Delta H$ of the YIG crystal formed by TSFZ method and the YIG crystal formed by flux method.

First, the structure and the operation of the YIG device according to the present embodiment will be explained with reference to FIGS. 1A, 1B and 2.

A central core 12 is provided inside a pot-shaped magnetic core 10. A plate-shaped magnetic core 14 is disposed on the top of the pot-shaped magnetic core 10 and closes the opening of the pot-shaped magnetic core 10. An excitation coil 26 is wound on the central core 12. A direct current voltage can be applied to the excitation coil 26 from the outside via a power source terminal 28.

A YIG crystal (hereinafter called "YIG sphere") 16 formed in a spherical shape is disposed between the upper end surface of the central core 12 and the plate-shaped magnetic core 14. The YIG sphere 16 is provided on one end of a support rod 18 formed in parallel with the inside surface of the plate-shaped magnetic core 14. The other end of the support rod 18 is secured to the inside surface of the plate-shaped magnetic core 14 by fixing means 20.

An integrated circuit substrate 22 is secured to the inside surface of the plate-shaped magnetic core 14. A semicircular coupling coil 24 is secured to the integrated circuit board 22 for positioning the YIG sphere 16 at the center (see FIG. 1B).

An oscillation circuit as exemplified in FIG. 2 is formed on the integrated circuit board 22. The YIG sphere 16 and the coupling coil 24 form a resonator 32, and the YIG sphere is electromagnetically coupled with the integrated circuit board 22 by the coupling coil 24. The coupling coil 24 is connected to the emitter electrode of a transistor 34. The base electrode of the transistor 34 is grounded via an inductor 36. Matching means 38 is connected to the collector electrode of the transistor 34. The output of the matching means 38 is the output of the resonator.

The integrated circuit board 22 is connected to a coaxial connector 30 disposed outside of the plate-shaped magnetic core 14 so that signals from the integrated circuit board 22 can be outputted.

A direct current magnetic field is applied to the YIG sphere 16 by applying a direct current voltage to the excitation coil 26 from the outside via the power source terminal 28 and flowing a direct current to the excitation coil 26. The applied magnetic field resonates the YIG sphere 16. The resonance frequency of the YIG sphere 16 is proportional to the intensity of the magnetic field applied to the YIG sphere 16, and the current to be flowed to the excitation coil 26 is suitably controlled to thereby obtain a required resonance frequency.

The YIG sphere 16 forms an oscillation circuit together with an active circuit formed on the integrated circuit board 22 electromagnetically coupled by the coupling coil 24. The magnetic field applied to the YIG sphere 16 is changed to thereby change the oscillation frequency. The oscillation output can be transmitted to the outside from the coaxial connector 30 provided on the plate-shaped magnetic core 14.

Here, the YIG device according to the present embodiment is characterized mainly in that the YIG sphere 16, which is a major member forming the YTG device, is formed of a YIG single crystal in which a part of yttrium (Y) is substituted by gadolinium (Gd). Specifically, the YIG sphere 16 is formed of a material whose composition is expressed by $Y_{3-x}Gd_xFe_5O_{12}$. In another aspect, the YIG sphere 16 may be formed of a material in which a part of the iron (Fe) is substituted by a trivalent transition metal or a group-III element (indicated by M) in addition to the partial substitution of the yttrium noted above, and having the composition expressed by $Y_{3-x}Gd_xFe_{5-y}M_yO_{12}$. A part of the iron may be substituted by 2 or more trivalent transition metals or group-III elements.

Because a part of yttrium of the YIG sphere 16 is substituted by gadolinium as noted above, the applied electric power (threshold electric power) for the resonance saturation can be increased, and the temperature coefficient for the $\Delta H$ can be controlled.

FIG. 3 is a graph showing relationships between the threshold electric power and the frequency. The unit dBm of the vertical axis corresponds to the exponential expression of mW where −10 dBm corresponds to 0.1 mW; 0 dBm corresponds to 1 mW; and 10 dBm corresponds to 10 mW. FIG. 3 shows the result of the measurement made on a YIG crystal having a 800 Gauss saturation magnetization machined in a spherical shape.

As shown, in the YIG device according to the present embodiment, where a part of yttrium is substituted with gadolinium (Characteristic A in the graph) and the YIG device having yttrium not substituted with gadolinium (Characteristic B in the graph), the YIG devices resonate at frequencies above the lower limit tuning frequency, and the threshold electric power increase as the frequency increases. In comparing the threshold electric power $P_{th}$ for the same frequency, the YIG device according to the present embodiment, having a part of yttrium substituted with gadolinium (Characteristic A in the graph) has larger threshold electric power $P_{th}$ than the YIG device having yttrium not substituted with gadolinium (Characteristic B in the graph). That is, it is found that the substitution of a part of yttrium with gadolinium makes it difficult for the resonance saturation to take place.

FIG. 4 is a graph showing the temperature dependency of the $\Delta H$. In the graph, the ♦ marks indicate that for the gadolinium composition ratio x=0 ($Y_3Fe_5O_{12}$), the ● marks indicate that for the gadolinium composition ratio x=0.05 ($Y_{2.95}Gd_{0.05}Fe_5O_{12}$), and the x marks indicate that for the gadolinium composition ratio x=0.10 ($Y_{2.9}Gd_{0.1}Fe_5O_{12}$). As shown, in the YIG element which contains no gadolinium (indicated by the ♦ marks), the $\Delta H$ tends to increase as the temperature rises. Undesirably, the changes of the $\Delta H$ in the temperature range of the room temperature to about 400 K, which is the temperature range where the YIG devices are generally used, are very large.

On the other hand, in the YIG element containing gadolinium, as the gadolinium composition ratio x increases, the negative temperature gradient is added to the temperature coefficient of the $\Delta H$, and the temperature coefficient changed from positive to negative. In the YIG element with the gadolinium composition ratio x=0.05 (indicated by the ● marks), the temperature dependency of the $\Delta H$ is substantially not found, and the characteristic is substantially flat in the temperature range of the room temperature to about 400 K, which is the temperature range where the YIG devices are generally used. In the YIG element with the gadolinium composition ratio x=0.10 (indicated by the x marks), the temperature dependency of the $\Delta H$ is opposite; the $\Delta H$ tends to decrease as the temperature rises.

FIG. 5 is a graph showing relationships between the threshold electric power and the gadolinium composition ratio and relationships between the $\Delta H$ and the gadolinium composition ratio. In the graph, the ● marks indicate the relationships between the threshold electric power and the gadolinium composition ratio, and the ♦ marks indicate the relationships between the $\Delta H$ and the gadolinium composition ratio.

As shown, the gadolinium composition ratio x is increased to thereby increase the threshold electric power $P_{th}$. On the other hand, the increase of the gadolinium composition ratio x increases the $\Delta H$. With the gadolinium composition ratio x=0.1 or above, the $\Delta H$ becomes undesirably four times or more than that without gadolinium.

The YIG sphere 16 used in the YIG device preferably has a large threshold electric power and a small $\Delta H$. However, as shown in FIG. 5, the threshold electric power and the $\Delta H$ increase as the gadolinium composition ratio x increases. Accordingly, it is preferable that the gadolinium composition ratio x is suitably set in accordance with required characteristics of the YIG sphere 16 in taking the threshold electric power and the $\Delta H$ into consideration.

Considering the results of FIGS. 4 and 5, the content of gadolinium in the YIG sphere 16 of $Y_{3-x}Gd_xFe_5O_{12}$ is set preferably in the range of 0<x<0.1, more preferably near x≈0.05, where the change of the $\Delta H$ in the general use temperature range are very small.

In the polycrystalline YIG, whose $\Delta H$ is intrinsically large, the influence of the addition of gadolinium on the $\Delta H$ is small. However, in the single crystalline YIG whose $\Delta H$ is required to be small, it is necessary to limit the addition quantity of gadolinium so as to suppress the increase of the $\Delta H$.

The YIG sphere 16 of the YIG device according to the present embodiment may be formed of a material of the composition expressed by $Y_{3-x}Gd_xFe_{5-y}M_yO_{12}$ having a part of the yttrium substituted with gadolinium and, in addition, a part of the iron substituted with at least one kind of trivalent transition metal element or a group-III element (indicated by M).

The trivalent transition metal element or the group-III element substituting the iron may be aluminum (Al), gallium (Ga) or others. Because the part of the iron is substituted with such element as noted above, the saturation magnetization can be suitably controlled.

The composition ratio y of the element M is set preferably to a range of $0 \leq y < 1.5$. The composition ratio y of the element M is set to less than 1.5, because with the composition ratio y exceeding 1.5, the magnetic ordering dislocation temperature (Curie temperature) becomes below the room temperature, and the YIG sphere 16 becomes non-magnetic in the operation temperature range. Even when the device is cooled and kept below the Curie temperature, the ΔH is unusably wide (the Q value is low) due to the large addition quantity.

The YIG sphere 16 of the present embodiment is crystal-grown preferably by TSFZ (Traveling Solvent Floating Zone) method.

Conventionally, the single crystalline YIG has been grown by a flux method. In the flux method, a crystal raw material and a flux is loaded in a crucible and melted, and then gradually cooled or, the flux is evaporated, whereby the single crystal is grown. However, in the crystal growth by the flux method, the distribution of the additives in the crystal inevitably occurs due to temperature changes and composition changes in the single crystal growth, so that it is difficult to control traces of the additives. Accordingly, it is difficult to grow a single crystalline material, such as that of the YIG sphere 16 of the YIG device according to the present embodiment, which uniformly contains a trace of gadolinium.

On the other hand, in the TSFZ method, a crystal raw material rod with a prescribed quantity of the additive added in advance is melted and is grown on a seed crystal, the temperature and the composition in the crystal growth are constant, and the TSFZ method can grow single crystals uniformly containing traces of additives. Thus, the TSFZ method is suitable to grow the single crystalline material containing a trace of gadolinium, as of the YIG sphere 16 of the YTG device according to the present embodiment.

FIG. 6 is a view showing the infrared concentrated heating furnace used in the crystal growth by the TSFZ method.

The crystal raw material rod 42 held by raw material supporting means 40, and the seed crystal 46 held by a seed crystal supporting means 44 are supported on the same axis. The crystal raw material rod 42 and the seed crystal 46 are supported respectively by an upper main shaft 48 and a lower main shaft 50 and are axially movable.

The crystal raw material rod 42 and the seed crystal 46 are disposed in a quartz glass pipe 52. The quartz glass pipe 52 has an ambient gas inlet port 54 and an ambient gas outlet port 56. A prescribed ambient gas is flowed between the ports to thereby establish a prescribed ambient atmosphere in the quartz glass pipe 52.

An ellipsoidal mirror 58 is disposed around the quartz glass pipe 52, surrounding the quartz glass pipe 52. A halogen lamp 60 is disposed at one focus of the ellipsoidal mirror 58. The crystal raw material rod 42 is arranged with the forward end positioned at the other focus of the ellipsoidal mirror 58, so that heat rays emitted from the halogen lamp 60 are applied to the forward end of the crystal raw material rod 42.

The heat rays emitted from the halogen lamp 60 are condensed by the ellipsoidal mirror 58 to be applied to the crystal raw material rod 42, and a molten zone 62 is formed at the lower part of the crystal raw material rod 42. In this state, the seed crystal 46 is brought into contact with the molten zone 62, and with the seed crystal 46 set on rotation, the seed crystal 46 and the crystal raw material rod 42 are moved down gradually to grow the molten raw material in the molten zone 62 into a single crystal on the seed crystal 46. The process of the growth of the single crystal can be monitored by a CCD camera 64.

In the TSFZ method, the composition of the crystal raw material rod 42 and the molten composition in the molten zone 62 are suitably selected to thereby grow a single crystal of a required composition. In comparison with the flux method, etc., the TSFZ method can drastically decrease the mixture of impurities but can precisely mix additives to be mixed even in traces.

FIG. 7 is a graph showing the fluctuations of the ΔH of the YIG element formed by using the single crystalline YIG grown by the TSFZ method and that grown by the flux method. The values of the ΔH are taken on the horizontal axis, and the ratios of distribution relative to the whole are taken on the vertical axis.

As shown, the YIG element formed by the TSFZ method has smaller ΔH in comparison with the YIG element formed by the flux method. It is found that the TSFZ method can form the YIG element having small fluctuations of the ΔH and stable characteristics.

As described above, the TSFZ method is very effective to grow the single crystalline YIG of the YIG element according to the present embodiment.

As described above, according to the present embodiment, the YIG element of a single crystalline YIG having a part of yttrium substituted with gadolinium is formed, whereby the threshold electric power for generating the resonance saturation can be increased. The YIG crystal expressed by $Y_{3-x}Gd_xFe_5O_{12}$ has the composition ratio x of gadolinium set at the range of 0<x<0.1, whereby while the increase of the ΔH is suppressed low, the threshold electric power can be increased. The temperature dependency of the ΔH can be made small. The composition ratio x of gadolinium is set near 0.05, whereby the ΔH in the temperature range where the YIG device is generally used can be made substantially constant.

The threshold electric power for generating the resonance saturation is increased, whereby the input power to be applied to the YIG element can be made larger. Thus, the resonator of high oscillation output and a wide band can be realized.

The present invention is not limited to the above-described embodiment and can cover other various modifications.

For example, in the above-described embodiment, the YIG crystal according to the present invention is applied to the YIG tuning oscillator but is applicable to other YIG devices. For example, the YIG element according to the present invention may be applied to YIG devices, such as YIG tuning filters, etc.

Figure 8:
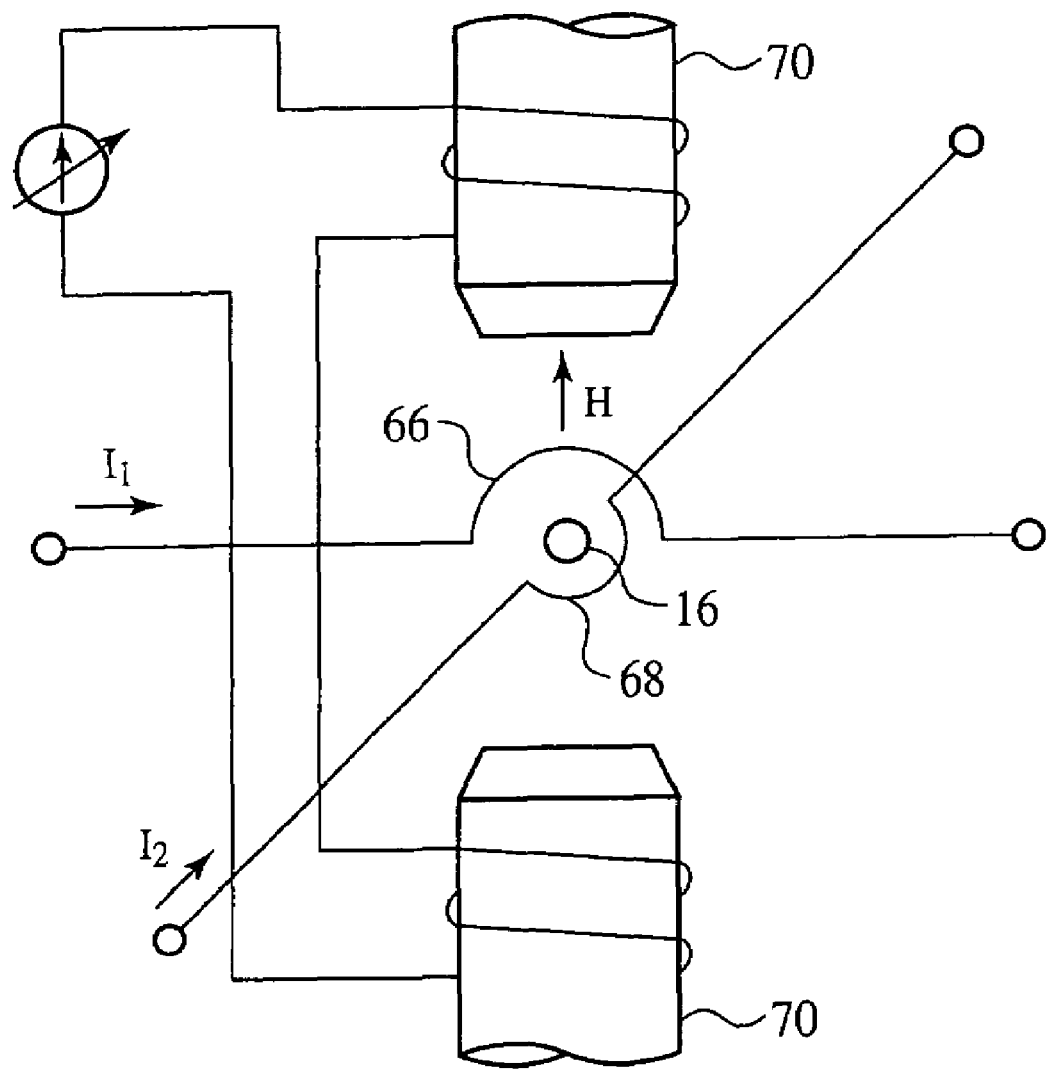
FIG. 8 is a diagrammatic sectional view of the YIG device according to a modification of the embodiment of the present invention, which shows a structure thereof.

As exemplified in FIG. 8, the YIG tuning filter can comprise the YIG sphere 16, a magnet 70 for applying required magnetic fields to the YIG sphere 16, an input coupling loop 66 magnetically connected to the YIG sphere 16, and an output coupling loop 68.

In the above-described embodiment, the YIG crystal is formed in a spherical shape but is not essentially spherical. Generally, the spherical YIG crystal has the relationship of f=γH between the resonance frequency f and the outside magnetic field H, is easy to design, but disc-shaped or needle-shaped resonators can be formed. Especially, the disc-shaped YIG element has the oscillation frequency f expressed by f=γ(H−4ΠMs), and the oscillation frequency is lower than that of the spherical YIG element. The disc-shaped YIG crystal is applicable to low-frequency devices. However, the resonance frequency f depends on 4ΠMs, and the change of the saturation magnetization (Ms) due to the temperature change directly results in the change of the resonance frequency due to the temperature change. Contrivances for stabilizing the temperature are required. The plate-shaped YIG element can be used not in the resonators but in circulators, retardation lines, or other applications.

INDUSTRIAL APPLICABILITY

The YIG crystal according to the present invention has a small ΔH and a low temperature dependency. The YIG crystal also has a high threshold electric power. Accordingly, the YIG crystal according to the present invention is very useful in YIG devices requiring high oscillation output and wide frequency bands, and applications, such as spectrum analyzers, network analyzer, etc. using such YIG devices.

The invention claimed is:

1. A single crystalline magnetic garnet comprising:
a single crystal of a gadolinium-substituted yttrium iron garnet having a part of yttrium substituted with gadolinium,
wherein a composition of the gadolinium-substituted yttrium iron garnet is $Y_{3-x}Gd_xFe_5O_{12}$, and a composition ratio x of gadolinium is in a range of 0<x<0.1.

2. A single crystalline magnetic garnet comprising:
a single crystal of a gadolinium-substituted yttrium iron garnet having a part of yttrium substituted with gadolinium,
wherein a part of iron in the single crystal is substituted with at least one element selected out of groups including trivalent transition metal elements and group-III elements, and
wherein a composition of the gadolinium substituting yttrium iron garnet is $Y_{3-x}Gd_xFe_{5-y}M_yO_{12}$, and a composition ratio y of the element M substituting the iron is in a range of 0=y<1.5.

3. A single crystalline magnetic garnet comprising:
a single crystal of a gadolinium-substituted yttrium iron garnet having a part of yttrium substituted with gadolinium,
wherein a part of iron in the single crystal is substituted with at least one element selected out of groups including trivalent transition metal elements and group-III elements, and
wherein a composition of the gadolinium substituting yttrium iron garnet is $Y_{3-x}Gd_xFe_{5-y}M_yO_{12}$, a composition ratio x of gadolinium is in a range of 0<x<0.1, and a composition ratio y of the element M substituting the iron is in a range of 0=y<1.5.

* * * * *